(12) United States Patent
AuBuchon et al.

(10) Patent No.: US 11,049,694 B2
(45) Date of Patent: Jun. 29, 2021

(54) MODULAR MICROWAVE SOURCE WITH EMBEDDED GROUND SURFACE

(71) Applicant: Applied Materials, Inc., Santa Clara, CA (US)

(72) Inventors: Joseph F. AuBuchon, San Jose, CA (US); James Carducci, Sunnyvale, CA (US); Larry D. Elizaga, Tracy, CA (US); Richard C. Fovell, San Jose, CA (US); Philip Allan Kraus, San Jose, CA (US); Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/586,597

(22) Filed: Sep. 27, 2019

(65) Prior Publication Data

US 2021/0098236 A1    Apr. 1, 2021

(51) Int. Cl.
*H01J 37/32* (2006.01)
*H01P 1/208* (2006.01)

(52) U.S. Cl.
CPC .. *H01J 37/32256* (2013.01); *H01J 37/32266* (2013.01); *H01J 2237/0817* (2013.01); *H01J 2237/334* (2013.01); *H01J 2237/335* (2013.01); *H01P 1/2084* (2013.01)

(58) Field of Classification Search
None
See application file for complete search history.

(56) References Cited

U.S. PATENT DOCUMENTS

| | | | |
|---|---|---|---|
| 6,983,892 B2* | 1/2006 | Noorbakhsh | ..... C23C 16/45565 239/553.3 |
| 7,205,868 B2* | 4/2007 | Park | ........................ H01P 1/205 333/203 |
| 7,449,981 B2* | 11/2008 | Park | ........................ H01P 1/205 333/203 |
| 10,504,699 B2* | 12/2019 | Kraus | ...................... H03B 5/24 |
| 2013/0228284 A1 | 9/2013 | Denpoh et al. | |
| 2018/0053634 A1* | 2/2018 | Kraus | ............... H01J 37/32192 |
| 2018/0323043 A1* | 11/2018 | Kraus | ............... H01J 37/32201 |
| 2019/0326090 A1* | 10/2019 | Nguyen | ............ H01J 37/32082 |

(Continued)

FOREIGN PATENT DOCUMENTS

| | | |
|---|---|---|
| CN | 108231624 | 6/2018 |
| KR | 10-1246191 | 3/2013 |
| KR | 10-2015-0025242 | 3/2015 |

OTHER PUBLICATIONS

International Search Report and Written Opinion from U.S. Patent Application No. PCT/US2020/051428 dated Dec. 29, 2020. 8 pgs.

*Primary Examiner* — Amy Cohen Johnson
*Assistant Examiner* — Srinivas Sathiraju
(74) *Attorney, Agent, or Firm* — Schwabe, Williamson & Wyatt, P.C.

(57) ABSTRACT

Embodiments disclosed herein include a source for a processing tool. In an embodiment, the source comprises a dielectric plate having a first surface and a second surface opposite from the first surface, and a cavity into the first surface of the dielectric plate. In an embodiment, the cavity comprises a third surface that is between the first surface and the second surface. In an embodiment, the source further comprises a dielectric resonator extending away from the third surface.

20 Claims, 14 Drawing Sheets

(56) References Cited

U.S. PATENT DOCUMENTS

2019/0326096 A1\* 10/2019 Kraus ................ H01Q 21/0025
2019/0326098 A1\* 10/2019 Nguyen ............ H01J 37/32201
2020/0013594 A1\* 1/2020 Lane ................. H01J 37/32678

\* cited by examiner

MODULAR MICROWAVE SOURCE WITH EMBEDDED GROUND SURFACE

BACKGROUND

1) Field

Embodiments relate to the field of semiconductor manufacturing and, in particular, to modular microwave sources with embedded ground surfaces surrounding the dielectric resonator.

2) Description of Related Art

High-frequency plasma sources may include a dielectric resonator that is disposed over a dielectric plate. A grounded housing surrounds the dielectric resonator. In order to improve injection of the high-frequency electromagnetic radiation into the processing chamber, the dielectric resonator may be placed in a cavity into the dielectric plate. However, the portion of the dielectric resonator within the cavity is no longer surrounded by the grounded housing. As such, the resonant characteristic of the dielectric resonator is diminished and coupling of the high-frequency electromagnetic radiation into the processing chamber is reduced.

SUMMARY

Embodiments disclosed herein include a source for a processing tool. In an embodiment, the source comprises a dielectric plate having a first surface and a second surface opposite from the first surface, and a cavity into the first surface of the dielectric plate. In an embodiment, the cavity comprises a third surface that is between the first surface and the second surface. In an embodiment, the source further comprises a dielectric resonator extending away from the third surface.

Embodiments further comprise an assembly for a processing tool. In an embodiment, the assembly comprises a source and a housing. In an embodiment, the source comprises a dielectric plate, a cavity into the dielectric plate, and a dielectric resonator in the cavity. In an embodiment, a width of the dielectric resonator is smaller than a width of the cavity so that a gap separates a sidewall of the dielectric resonator from a sidewall of the cavity. In an embodiment, the housing comprises a conductive body, and an opening through the conductive body. The dielectric resonator may be within the opening. In an embodiment, the housing further comprises a conductive ring in the gap separating the sidewall of the dielectric resonator from the sidewall of the cavity.

Embodiments disclosed herein may also comprise a processing tool. In an embodiment, the processing tool comprises a chamber and an assembly interfacing with the chamber. In an embodiment, the assembly comprises a source with a dielectric plate, a cavity in the dielectric plate, and a dielectric resonator in the cavity. In an embodiment, the housing comprises a conductive body with an opening. In an embodiment, the dielectric resonator is in the opening, and a conductive ring electrically coupled to the conductive body separates a sidewall of the dielectric resonator from a sidewall of the cavity.

DETAILED DESCRIPTION

Systems described herein include modular microwave sources with embedded ground surfaces surrounding the dielectric resonator. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the dielectric resonators may be disposed in cavities into the dielectric plate in order to improve coupling of electromagnetic radiation into the processing chamber. However, the resonant characteristic of the dielectric resonator is diminished when a grounded surface is not able to entirely surround the sidewall surfaces of the dielectric resonator. Accordingly, embodiments disclosed herein provide a conductive ring that is electrically coupled to the housing. The conductive ring rests in a gap between the sidewall of the dielectric resonator and a sidewall of the cavity to provide a grounded surface around an entire sidewall of the dielectric resonator.

In some embodiments, the conductive ring is a discrete component from the housing. In other embodiments, the conductive ring and the housing are a monolithic component. Embodiments may also include a source that comprises a dielectric plate and a discrete dielectric resonator. Other embodiments may include a source that comprises a dielectric plate and a dielectric plate that are a monolithic component.

Embodiments that include embedded ground surfaces that entirely surround the sidewalls of the dielectric resonator provide improved processing conditions in the processing chamber. For example, such architectures provide stronger coupling of the high-frequency electromagnetic radiation to the plasma. This has the ability to provide improved plasma uniformity and improved plasma density. As such, the uniformity of films deposited with a tool that implements such architectures is improved. Similarly, the uniformity of plasma treatments made with a tool that implements such architectures is improved as well.

Figure 1:
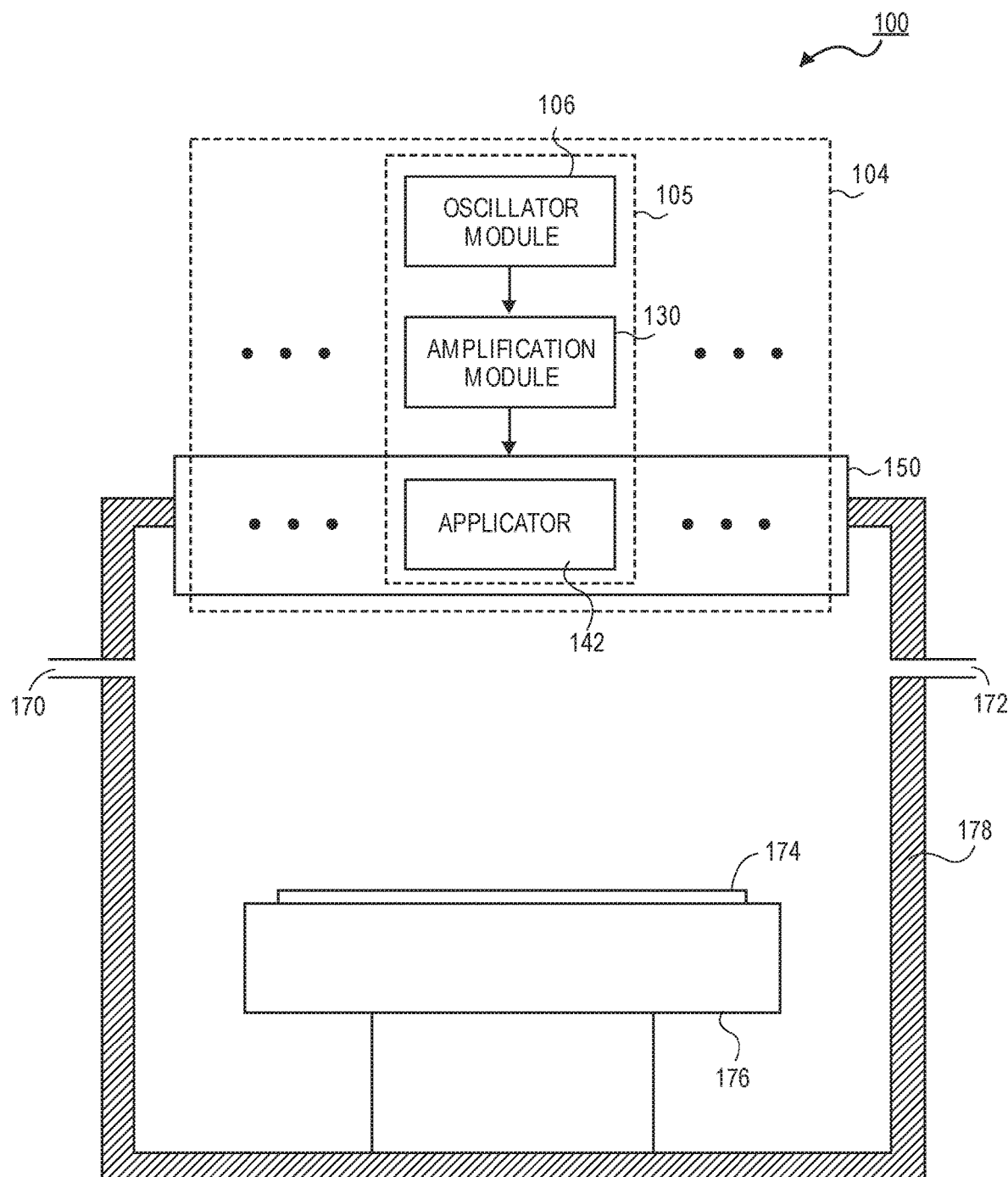
FIG. 1 is a schematic illustration of a processing tool that comprises a modular high-frequency emission source with a source array that comprises a plurality of applicators, in accordance with an embodiment.

Referring now to FIG. 1, a cross-sectional illustration of a plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning. Additional embodiments may include a processing tool 100 that utilizes high-frequency electromagnetic radiation without the generation of a plasma (e.g., microwave heating, etc.). As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that gas may also be injected into the chamber 178 through a source array 150 (e.g., as a showerhead) for evenly distributing the processing gases over a substrate 174.

In an embodiment, the substrate 174 may be supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. As shown, the applicators 142 are schematically shown as being integrated into the source array 150.

In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates high-frequency electromagnetic radiation that is transmitted to the amplification module 130. After processing by the amplification module 130, the electromagnetic radiation is transmitted to the applicator 142. In an embodiment, the applicators 142 each emit electromagnetic radiation into the chamber 178. In some embodiments, the applicators 142 couple the electromagnetic radiation to the processing gasses in the chamber 178 to produce a plasma.

Figure 2:
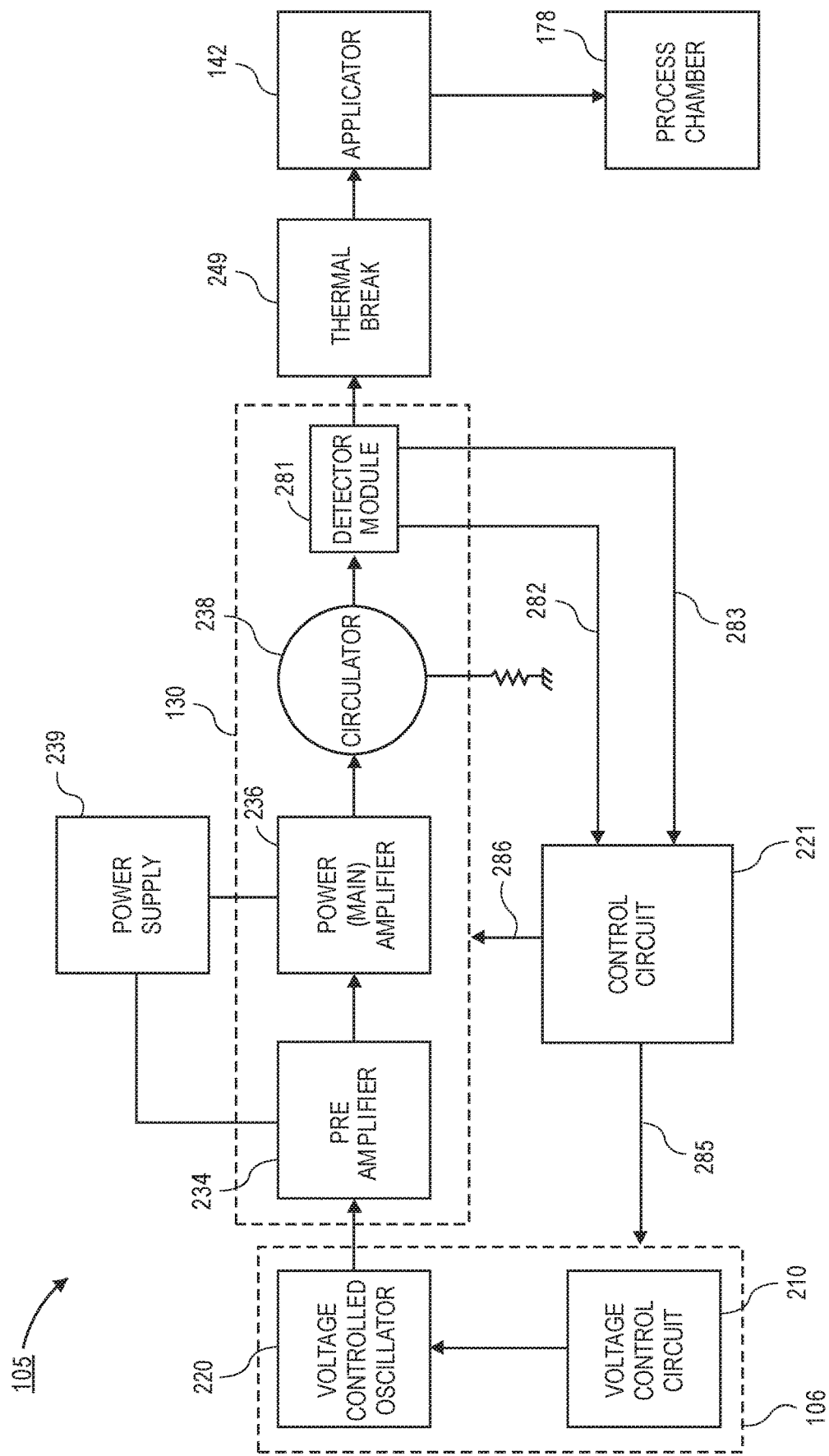
FIG. 2 is a block diagram of a modular high-frequency emission module, in accordance with an embodiment.

Referring now to FIG. 2, a schematic of a solid state high-frequency emission module 105 is shown, in accordance with an embodiment. In an embodiment, the high-frequency emission module 105 comprises an oscillator module 106. The oscillator module 106 may include a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 220 to an amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the thermal break 249 and the applicator 142 after being processed by the amplification module 130. However, part of the power transmitted to the thermal break 249 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system (e.g., between the circulator 238 and the thermal break 249). In an embodiment, the control circuit module 221 interprets the forward power 283 and the reflected power 282, and determines the level for the control signal 285 that is communicatively coupled to the oscillator module 106 and the level for the control signal 286 that is communicatively coupled to the amplification module 130. In an embodiment, control signal 285 adjusts the oscillator module 106 to optimize the high-frequency radiation coupled to the amplification module 130. In an embodiment, control signal 286 adjusts the amplification module 130 to optimize the output power coupled to the applicator 142 through the thermal break 249. In an embodiment, the feedback control of the oscillator module 106 and the amplification module 130, in addition to the tailoring of the impedance matching in the thermal break 249 may allow for the level of the reflected power to be less than approximately 5% of the forward power. In some embodiments, the feedback control of the oscillator module 106 and the amplification module 130 may allow for the level of the reflected power to be less than approximately 2% of the forward power.

Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 3:
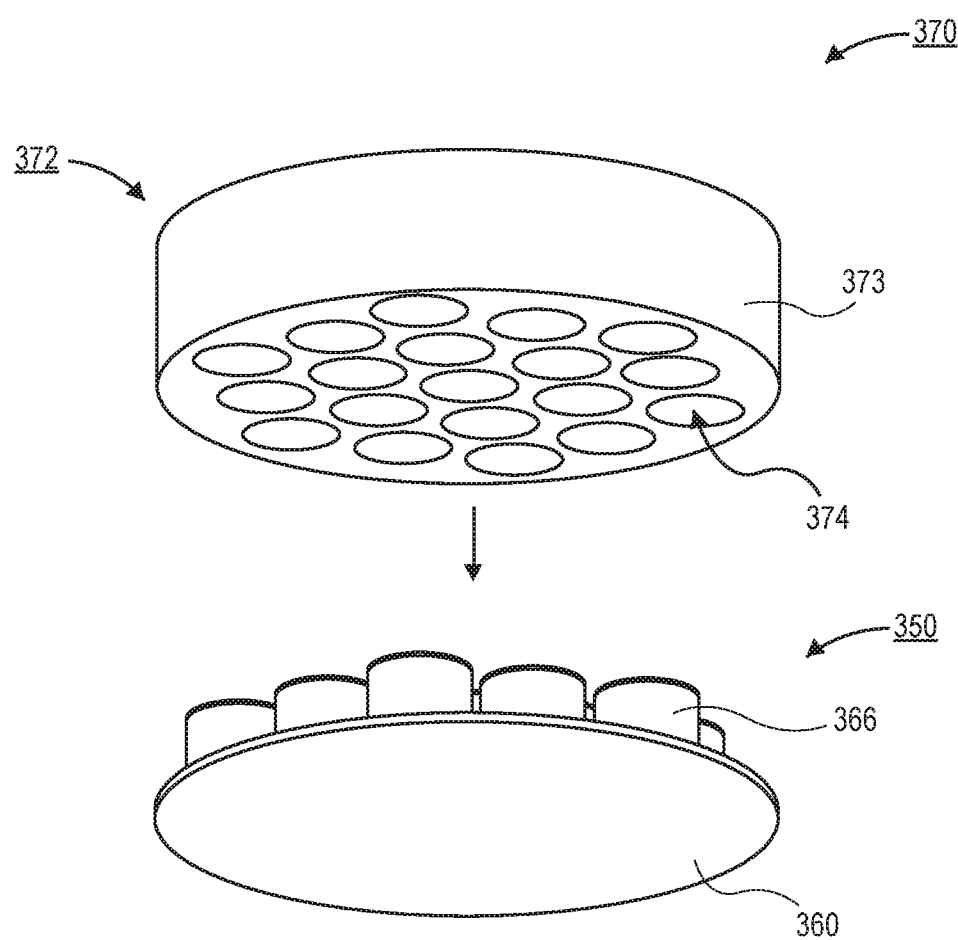
FIG. 3 is an exploded perspective view illustration of an assembly, in accordance with an embodiment.

Referring now to FIG. 3, an exploded perspective view illustration of an assembly 370 is shown, in accordance with an embodiment. In an embodiment, the assembly 370 comprises a source array 350 and a housing 372. As indicated by the arrows, the housing 372 fits over and around the source array 350. In the illustrated embodiment, the assembly 370 is shown as having a substantially circular shape. However, it is to be appreciated that the assembly 370 may have any desired shape (e.g., polygonal, elliptical, wedge shaped, or the like).

In an embodiment, the source array 350 may comprise a dielectric plate 360 and a plurality of dielectric resonators 366 that are over the dielectric plate 360. In an embodiment, the dielectric plate 360 and the plurality of dielectric resonators 366 are a monolithic structure. That is, there is no physical interface between a bottom of the dielectric resonators 366 and the dielectric plate 360. As used herein, a "physical interface" refers to a first surface of a first discrete body contacting a second surface of a second discrete body. In other embodiments the dielectric plate 360 and the dielectric resonators 366 are discrete components. Each of the dielectric resonators 366 are a portion of the applicator 142 used to inject high-frequency electromagnetic radiation into a processing chamber 178.

In an embodiment, the source array 350 comprises a dielectric material. For example, the source array 350 may be a ceramic material. In an embodiment, one suitable ceramic material that may be used for the source array 350 is $Al_2O_3$. In the aspect of a monolithic source array 350, the monolithic structure may be fabricated from a single block of material. In other embodiments, a rough shape of the monolithic source array 350 may be formed with a molding process, and subsequently machined to provide the final structure with the desired dimensions. For example, green state machining and firing may be used to provide the desired shape of the monolithic source array 350. In the illustrated embodiment, the dielectric resonators 366 are shown as having a circular cross-section (when viewed along a plane parallel to the dielectric plate 360). However, it is to be appreciated that the dielectric resonators 366 may comprise many different cross-sections. For example, the cross-section of the dielectric resonators 366 may have any shape that is centrally symmetric.

In an embodiment, the housing 372 comprises a conductive body 373. For example, the conductive body 373 may be aluminum or the like. The housing comprises a plurality of openings 374. The openings 374 may pass entirely through a thickness of the conductive body 373. The openings 374 may be sized to receive the dielectric resonators 366. For example, as the housing 372 is displaced towards the monolithic source array 350 (as indicated by the arrow) the dielectric resonators 366 will be inserted into the openings 374.

In the illustrated embodiment, the housing 372 is shown as a single conductive body 373. However, it is to be appreciated that the housing 372 may comprise one or more discrete conductive components. The discrete components may be individually grounded, or the discrete components may be joined mechanically or by any form of metallic bonding, to form a single electrically conductive body 373.

Figure 4A:
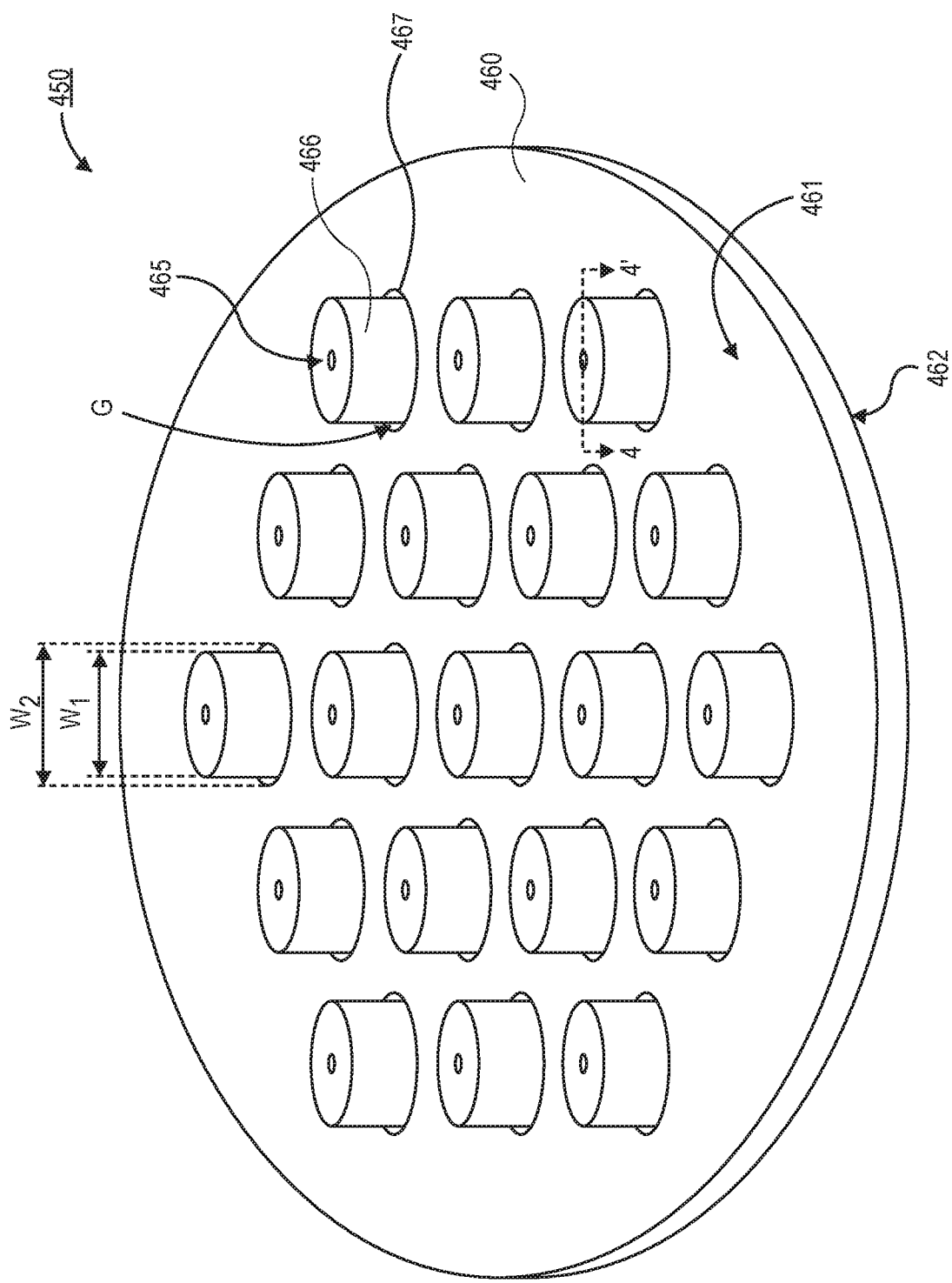
FIG. 4A is a perspective view illustration of a source array with dielectric resonators in cavities into a dielectric plate, in accordance with an embodiment.

Referring now to FIG. 4A, a perspective view illustration of a source array 450 is shown, in accordance with an embodiment. In an embodiment, the source array 450 comprises a dielectric plate 460. A plurality of cavities 467 are disposed into a first surface 461 of the dielectric plate 460. The cavities 467 do not pass through to a second surface 462 of the dielectric plate 460. The source array 450 may further include a plurality of dielectric resonators 466. Each of the dielectric resonators 466 may be in a different one of the cavities 467. Each of the dielectric resonators 466 may comprise a hole 465 in the axial center of the dielectric resonator 466.

In an embodiment, the dielectric resonators 466 may have a first width and the cavities 467 may have a second width $W_2$. The first width $W_1$ of the dielectric resonator 466 is smaller than the second width $W_2$ of the cavities 467. The difference in the widths provides a gap G between a sidewall of the dielectric resonators 466 and a sidewall of the cavity 467. In the illustrated embodiment, each of the dielectric resonators 466 are shown as having a uniform width $W_1$. However, it is to be appreciated that not all dielectric resonators 466 of a source array 450 need to have the same dimensions.

Figure 4B:
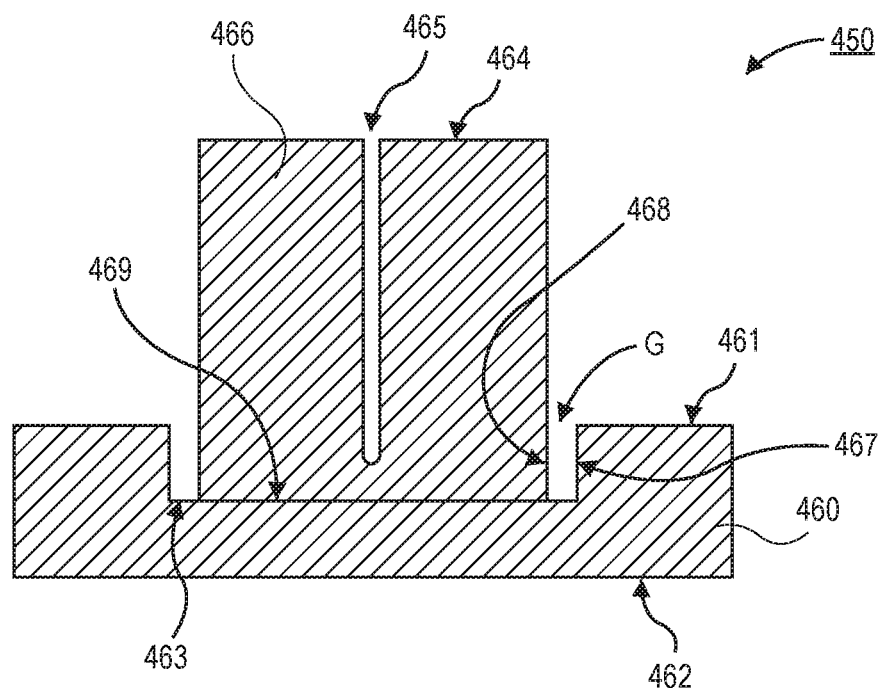
FIG. 4B is a cross-sectional illustration of the source array along line 4-4' where the dielectric resonator is a discrete component from the dielectric plate, in accordance with an embodiment.
Figure 4C:
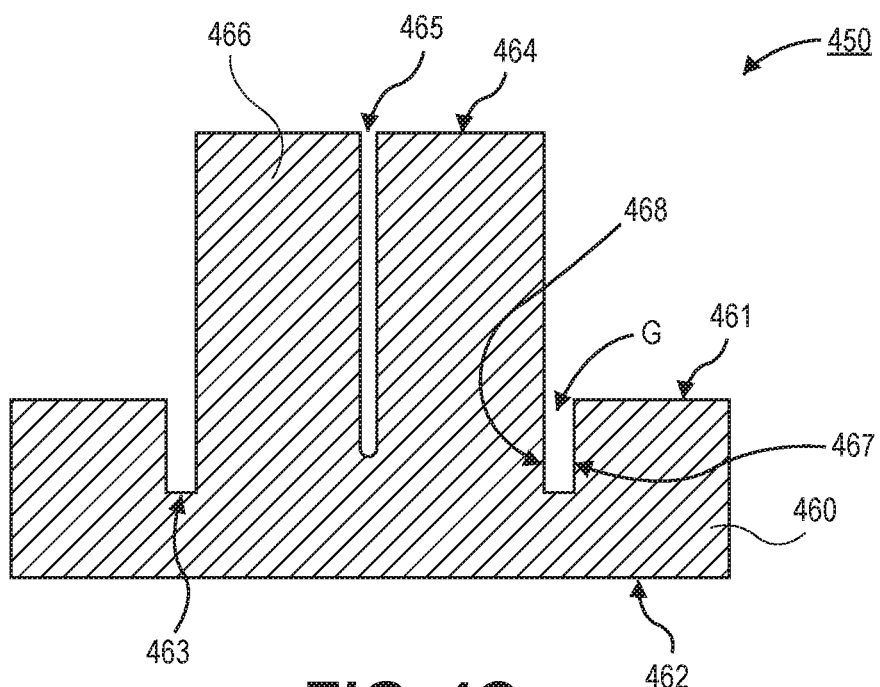
FIG. 4C is a cross-sectional illustration of the source array along line 4-4' where the dielectric resonator and the dielectric plate are a monolithic component, in accordance with an embodiment.

Referring now to FIGS. 4B and 4C, cross-sectional illustrations of the source array 450 in FIG. 4A along line 4-4' are shown, in accordance with various embodiments. The cross-sectional illustration along line 4-4' more clearly illustrates the cavity 467 and the surfaces of the various components.

Referring now to FIG. 4B, a cross-sectional illustration of a source array 450 that includes a discrete dielectric plate 460 and a discrete dielectric resonator 466 is shown, in accordance with an embodiment. The dielectric plate 460 includes a cavity 467. The cavity 467 extends down from the first surface 461 of the dielectric plate 460 and ends at a third surface 463 of the dielectric plate 460. In an embodiment, the dielectric resonator 466 has a first surface 469 that is supported by the third surface 463. That is, the dielectric resonator 466 sits at the bottom of the cavity 467. Furthermore, there is a physical interface between the first surface 469 of the dielectric resonator 466 and the third surface 463 of the dielectric plate 460. In an embodiment, a gap G is present between a sidewall surface 468 of the dielectric resonator 466 and the sidewall of the cavity 467.

In an embodiment, the dielectric resonator 466 comprises a hole 465 sized to accommodate a monopole antenna (not shown). The hole 465 extends down from a fourth surface 464 into the body of the dielectric resonator 466. In an embodiment, a bottom of the hole 465 is below (in the Z-direction) the first surface 461 of the dielectric plate 460. That is, the bottom of the hole 465 may be within the cavity 467. In other embodiments, a bottom of the hole 465 may be at or above (in the Z-direction) the first surface 461.

Referring now to FIG. 4C, a cross-sectional illustration of a source array 450 with a monolithic configuration is shown, in accordance with an additional embodiment. The monolithic configuration eliminates the physical interface between the dielectric resonator 466 and the dielectric plate 460. That is, the third surface 463 (i.e., the bottom of the cavity 467) is entirely outside a perimeter defined by the sidewalls 468 of the dielectric resonator 466.

The monolithic configuration results in the cavity 467 being a ring shape. Part of the cavity 467 is defined by the sidewall 468 of the dielectric resonator 466. Particularly, an interior surface of the ring cavity 467 is defined by the sidewall 468 of the dielectric resonator 466 and an outer surface of the ring cavity 467 is defined by a portion of the dielectric plate 460. In some instances, the cavity 467 may be referred to as a groove into the first surface 461 that surrounds the dielectric resonator 466. Similar to in FIG. 4B, a gap G is between the sidewall 468 of the dielectric resonator 466 and the outer sidewall of the cavity 467.

Figure 4D:
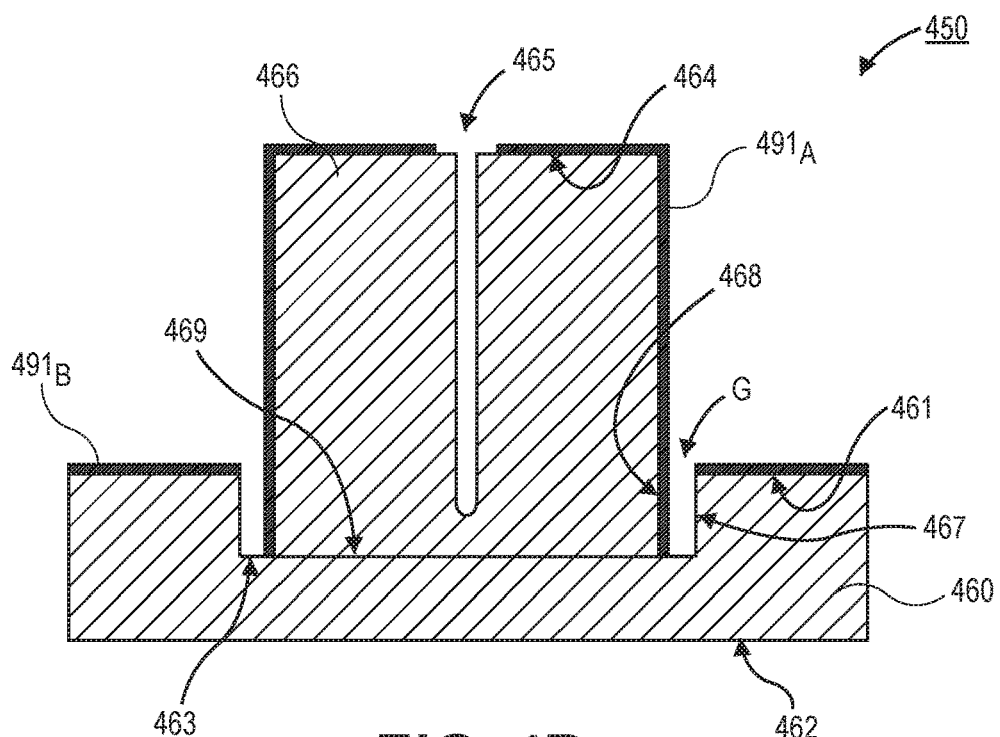
FIG. 4D is a cross-sectional illustration of the source array along line 4-4' where the dielectric resonator is a discrete component from the dielectric plate, and a conductive layer is disposed over surfaces of the dielectric resonator and the dielectric plate, in accordance with an embodiment.

Referring now to FIG. 4D, a cross-sectional illustration of a source array 450 is shown, in accordance with an additional embodiment. The source array 450 in FIG. 4D may be substantially similar to the source array 450 in FIG. 4B, with the exception that a conductive layer 491 is disposed over surfaces of the source array. For example, a first portion of the conductive layer $491_A$ may be over the fourth surface 464 and sidewall surfaces 468 of the dielectric resonator 466, and a second portion of the conductive layer $491_B$ may be over the first surface 461 of the dielectric plate 460. In an embodiment, the entire fourth surface 464 may not be covered by the first portion of the conductive layer $491_A$. For example, a portion of the fourth surface 464 proximate to the hole 465 may remain exposed. This may reduce the possibility of arcing between the conductive layer $491_A$ and the monopole antenna (not shown) that is inserted into the hole 465. In an embodiment, there is no conductive layer 491 over the third surface 463 and the sidewall of the cavity 467. However, in other embodiments, the conductive layer 491 may cover the sidewalls of the cavity 467 and a portion of the third surface 463. Particularly, the conductive layer 491 may cover portions of the third surface 463 that are not directly below the dielectric resonator 466. During operation, the conductive layer $491_{A-B}$ may be grounded. The conductive layer 491 may be any suitable conductive material, (e.g., aluminum, titanium, etc.).

Figure 4E:
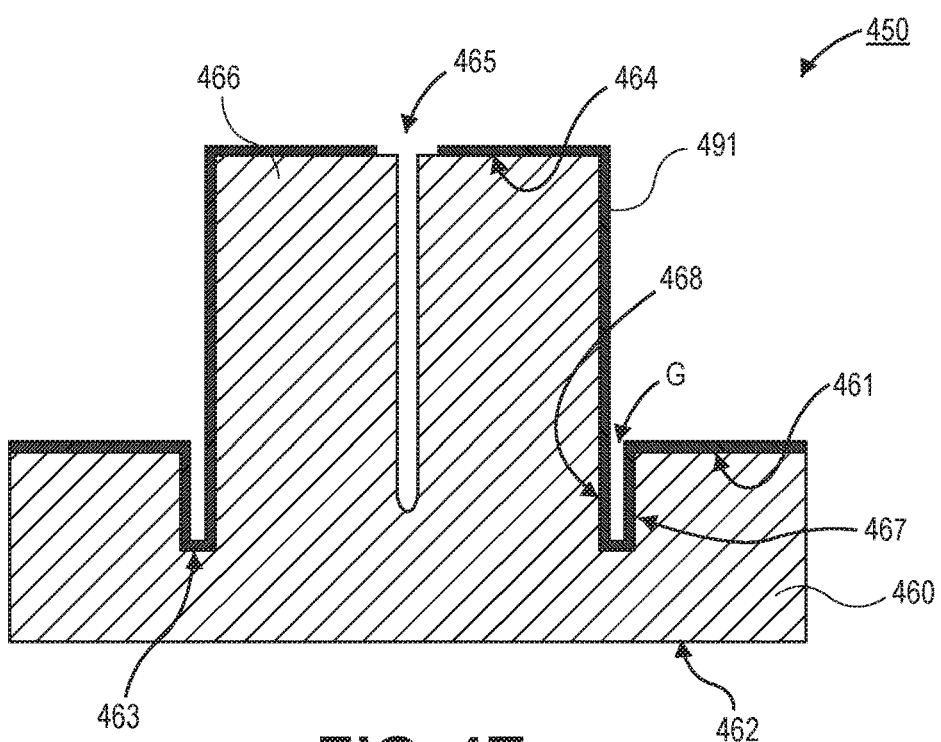
FIG. 4E is a cross-sectional illustration of the source array along line 4-4' where the dielectric resonator and the dielectric plate are a monolithic component, and a conductive layer is disposed over surfaces of the source array, in accordance with an embodiment.

Referring now to FIG. 4E, a cross-sectional illustration of a source array 450 is shown, in accordance with an additional embodiment. The source array in FIG. 4E may be substantially similar to the source array 450 in FIG. 4C, with the exception that a conductive layer 491 is disposed over surfaces of the source array 450. For example, the conductive layer 491 may be disposed over the first surface 461, the third surface 463, the fourth surface 464, and the sidewall surface of the cavity 467. In the illustrated embodiment, the gap G still remains. In other embodiments, the conductive layer 491 substantially fills the gap G.

Figure 5B:
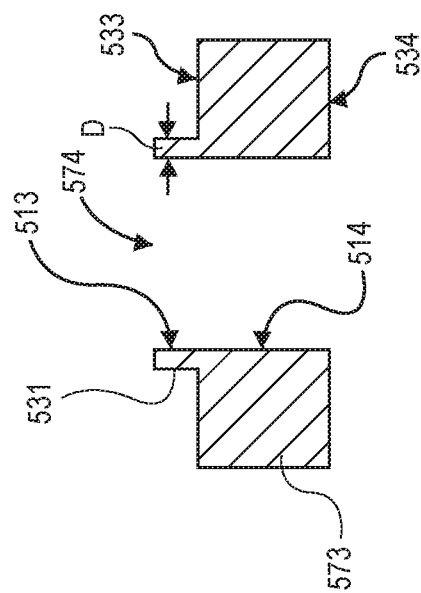
FIG. 5B is a cross-sectional illustration of the housing in FIG. 5A along line B-B', in accordance with an embodiment.
Figure 5A:
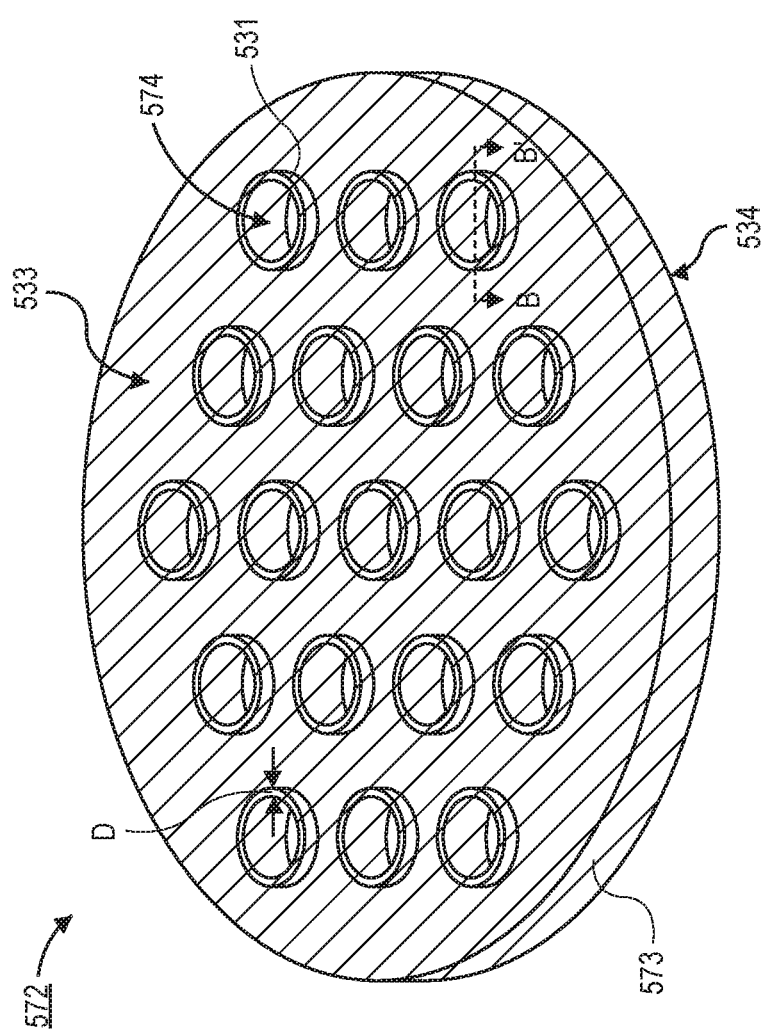
FIG. 5A is a perspective view illustration of a housing with monolithic rings around the openings, in accordance with an embodiment.

Referring now to FIG. 5A, a perspective view illustration of the housing 572 is shown, in accordance with an embodiment. The illustrated embodiment depicts a second surface 533 of the housing 572. The second surface 533 is the surface that faces towards the source array 450, and a first surface 534 faces away from the source array 450. As shown, the housing 572 comprises a conductive body 573 with a plurality of openings 574. The openings 574 are sized to receive the dielectric resonators 466 of the source array 450.

In an embodiment, the housing 572 further comprises a plurality of rings 531 that extend away from the second surface 533. The rings 531 and the conductive body 573 form a monolithic part in some embodiments. The rings 531 may be coincident with the openings 574. In an embodiment, an interior surface of the rings 531 is substantially coplanar with sidewalls of the openings 574. That is, a diameter of the interior of the rings 531 is the same as a diameter of the openings 574. In an embodiment, the rings 531 may have a width D. The width D may be chosen to fit into the gap G of the source array 450.

Referring now to FIG. 5B, a cross-sectional illustration of the housing 572 in FIG. 5A along line B-B' is shown, in accordance with an embodiment. As shown, the interior surface 513 of the ring 531 is substantially coplanar with the sidewall 514 of the opening 574. FIG. 5B also illustrates that the ring 531 and the conductive body 573 form a monolithic part.

Figure 5D:
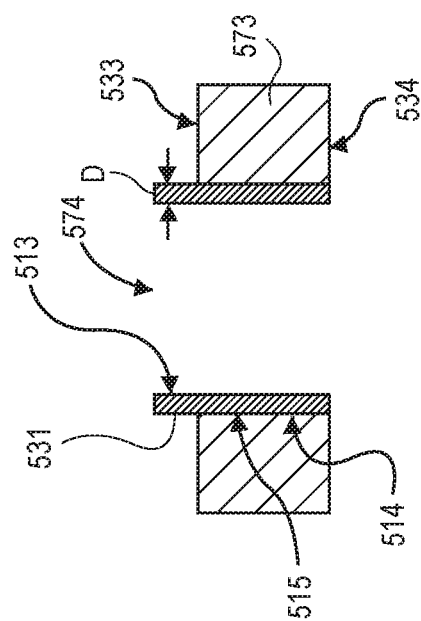
FIG. 5D is a cross-sectional illustration of the housing in FIG. 5C along line D-D', in accordance with an embodiment.
Figure 5C:
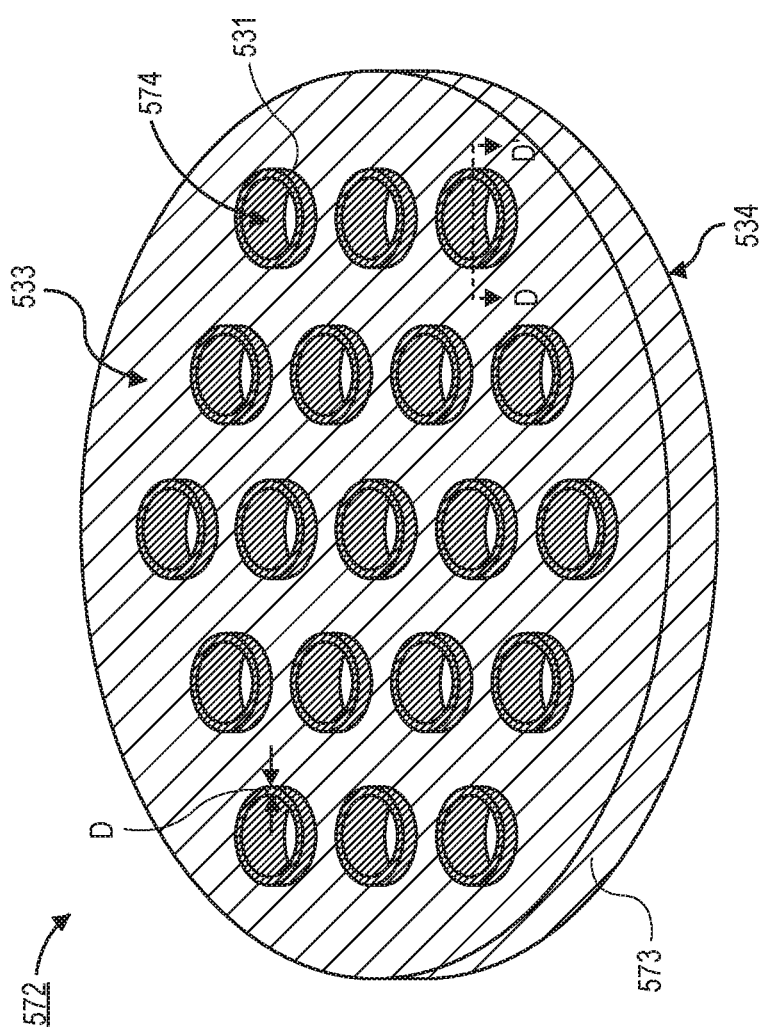
FIG. 5C is a perspective view illustration of a housing with rings inserted into the openings, in accordance with an embodiment.

Referring now to FIGS. 5C and 5D, a perspective view illustration and a corresponding cross-sectional illustration along line D-D' of a housing 572 are shown, in accordance with an additional embodiment. The housing 572 in FIG. 5C includes a discrete conductive body 573 and discrete rings 531. In an embodiment, each of the rings 531 is inserted into one of the openings 574. An outer surface 515 of the ring 531 is on the sidewall 514 of the opening 574. In an embodiment, a height of the ring 531 is greater than a height of the conductive body 573 so that a portion of the ring extends above the second surface 533 of the conductive body 573. In an embodiment, a thickness D of the ring 531 is sized to fit into the gap G of the source array 450.

Figure 6A:
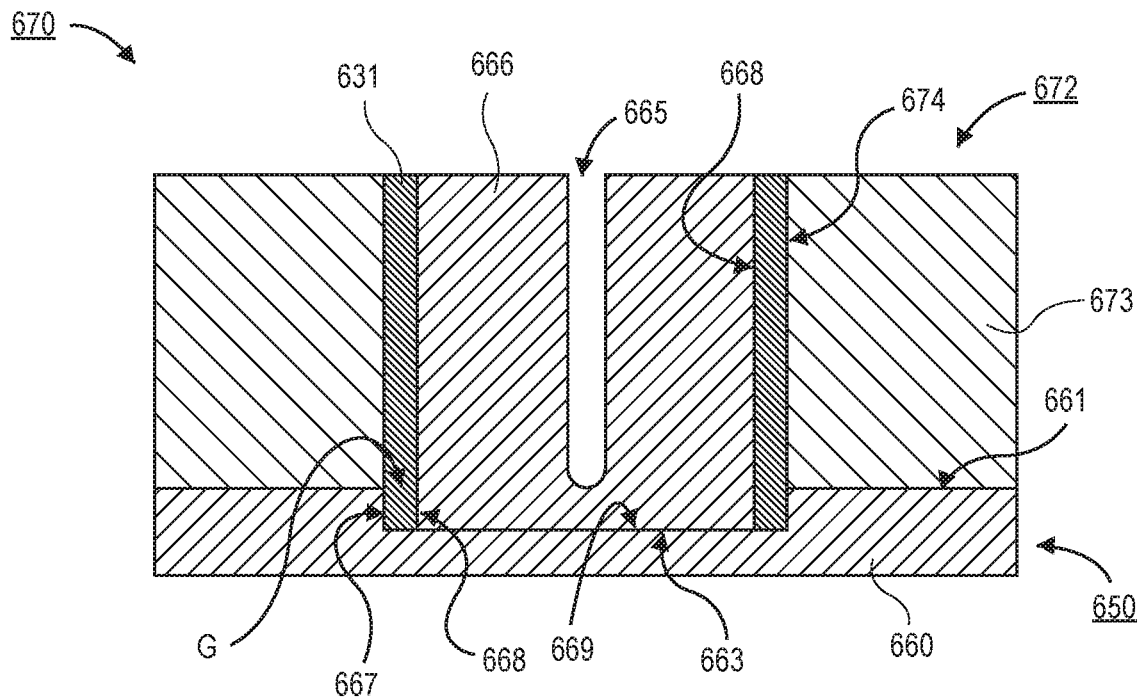
FIG. 6A is a cross-sectional illustration of an assembly with a source array with a discrete dielectric resonator and a discrete dielectric plate, and a housing with a discrete conductive body and a discrete ring in the opening, in accordance with an embodiment.

Referring now to FIG. 6A, a cross-sectional illustration of a portion of an assembly 670 is shown, in accordance with an embodiment. The assembly 670 includes a source array 650 and a housing 672. In an embodiment, the source array 650 includes a dielectric plate 660 and a dielectric resonator 666. The dielectric resonator 666 is a discrete component from the dielectric plate 660, similar to the source array 450 in FIG. 4B. That is, a first surface 669 of the dielectric resonator 666 is supported by the bottom surface 663 of the cavity 667. A hole 665 for a monopole antenna is formed into the dielectric resonator 666. The housing 672 comprises a conductive body 673 and a ring 631. The conductive body 673 and the ring 631 may be discrete components, similar to the housing 572 in FIGS. 5C and 5D. Accordingly, the opening 674 of the conductive body 673 may be lined by the ring 631. The ring 631 may, therefore, separate the sidewall of the opening 674 from the sidewall 668 of the dielectric resonator 666.

In an embodiment, the ring 631 fills the gap G between the sidewall 668 of the dielectric resonator 666 and the sidewall of the cavity 667 into the dielectric plate 660. That is, a portion of the ring 631 extends below (in the Z-direction) the first surface 661 of the dielectric plate 660. The ring 631 is electrically coupled to the conductive body 673 and is grounded during operation of the processing tool. Accordingly, the entire length of the sidewall 668 is covered by a grounded surface. This improves the resonance characteristics of the source array 650, and provides improved coupling of the high-frequency electromagnetic radiation into the processing chamber.

Figure 6B:
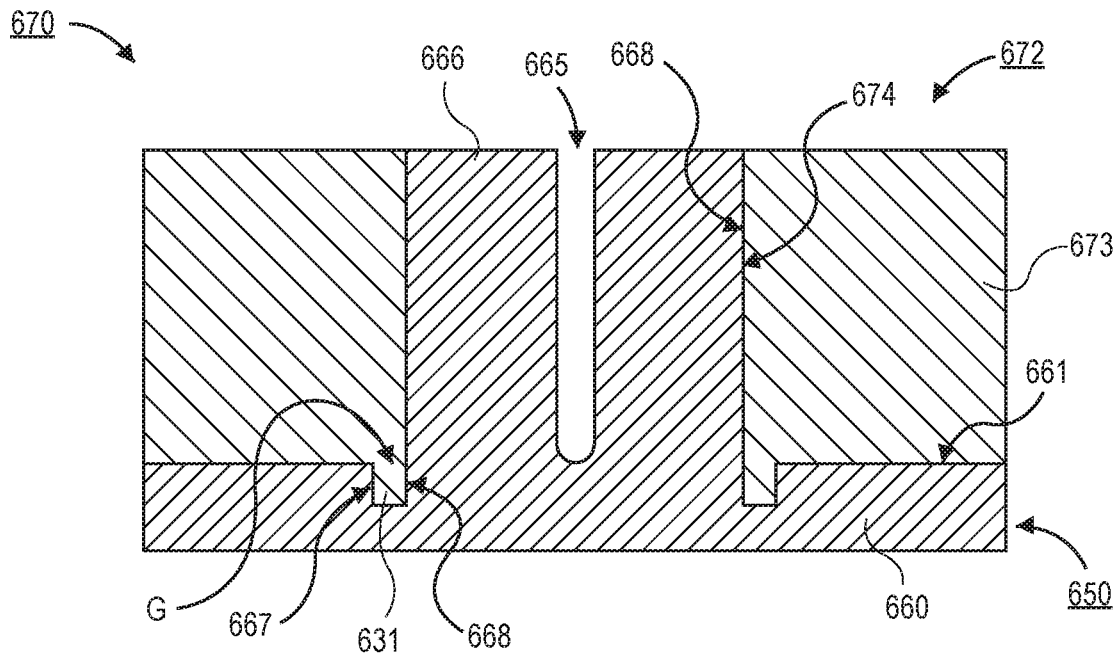
FIG. 6B is a cross-sectional illustration of an assembly with a monolithic source and a monolithic housing, in accordance with an embodiment.

Referring now to FIG. 6B, a cross-sectional illustration of an assembly 670 is shown, in accordance with an additional embodiment. The assembly 670 in FIG. 6B is similar to the assembly 670 in FIG. 6A with the exception that the dielectric resonator 666 and the dielectric plate 660 form a monolithic source array 650, and the ring 631 and the conductive body 673 form a monolithic housing 672. For example, the source array 650 is similar to the source array 450 in FIG. 4C, and the housing 672 is similar to the housing 572 in FIGS. 5A and 5B. In an embodiment, the ring 631 sits in the gap G and separates the sidewall of the cavity 667 from the sidewall 668 of the dielectric resonator 666. Accordingly, a portion of the housing 672 is embedded below in the dielectric plate 660 below the first surface 661. Furthermore, the sidewall of the opening 674 may face the sidewall 668 of the dielectric resonator without a discrete body in between the two surfaces.

Figure 6C:
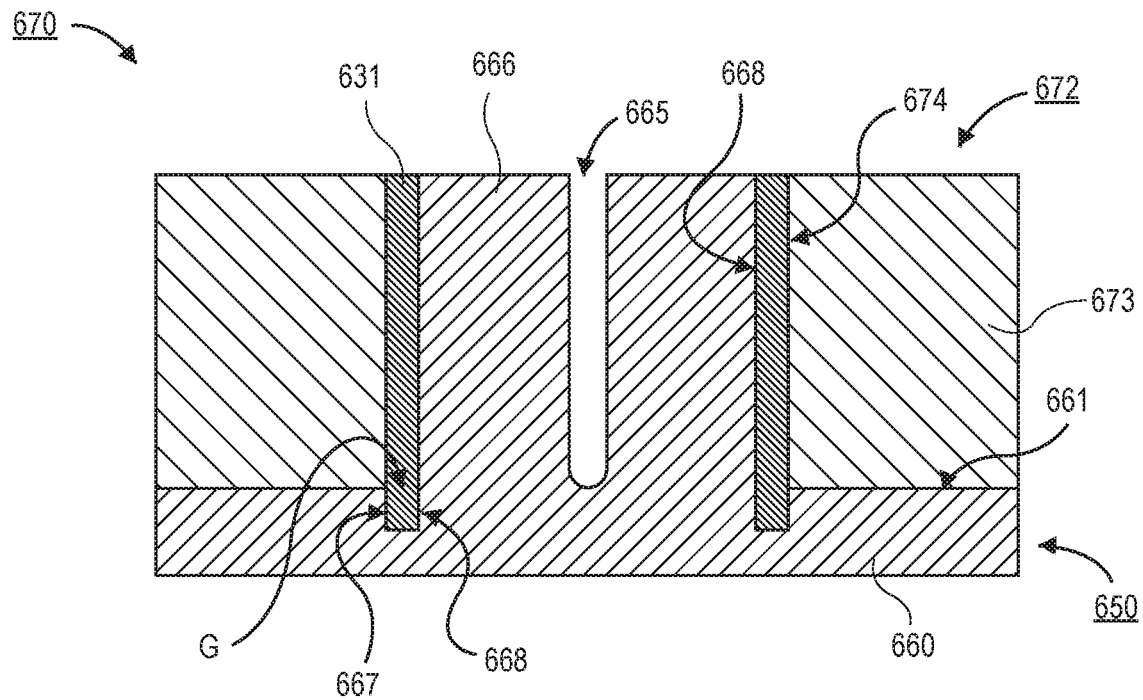
FIG. 6C is a cross-sectional illustration of an assembly with a monolithic source and a housing with a discrete conductive body and a discrete ring, in accordance with an embodiment.

Referring now to FIG. 6C, a cross-sectional illustration of an assembly 670 is shown, in accordance with an additional embodiment. The assembly 670 in FIG. 6C is similar to the assembly 670 in FIG. 6B, with the exception that the housing 672 comprises discrete components. For example, the housing 672 may comprise a conductive body 673 and a discrete ring 631. The housing 672 of the assembly 670 in FIG. 6C may be similar to the housing 672 described with respect to FIG. 6A.

Figure 6D:
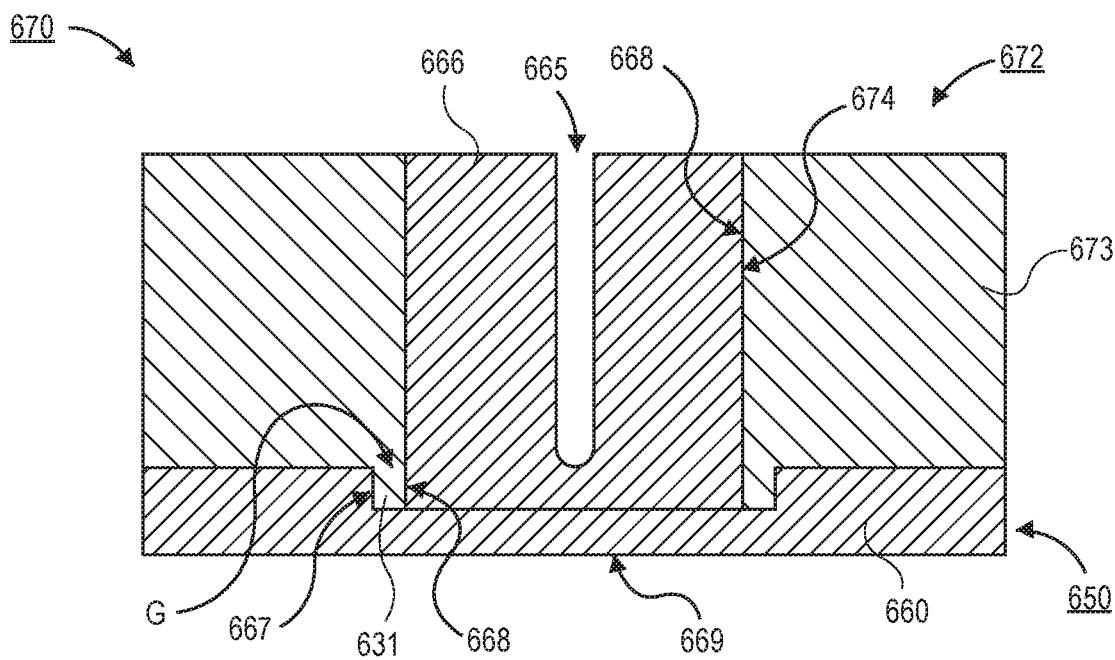
FIG. 6D is a cross-sectional illustration of an assembly with a source with a discrete dielectric resonator and a discrete dielectric plate and a monolithic housing, in accordance with an embodiment.

Referring now to FIG. 6D, a cross-sectional illustration of an assembly 670 is shown, in accordance with an additional embodiment. The assembly 670 in FIG. 6D is similar to the assembly 670 in FIG. 6B, with the exception that the source array 650 comprises discrete components. For example, the source array 650 comprises a dielectric plate 660 and a dielectric resonator 666 that are discrete components from each other. The source array 650 in FIG. 6D may be similar to the source array 650 described with respect to FIG. 6A.

As shown in FIGS. 6A-6D, embodiments include different combinations of discrete and monolithic components. For example, FIG. 6A includes all discrete components, FIG. 6B includes all monolithic components, FIG. 6C includes discrete housing components and a monolithic source array, and FIG. 6D includes a monolithic housing and discrete source array components. However, each of the illustrated embodiments include an embedded ground surface that is below the first surface 661 of the dielectric plate 660 and that surrounds a portion of the dielectric resonator 666.

Figure 7:
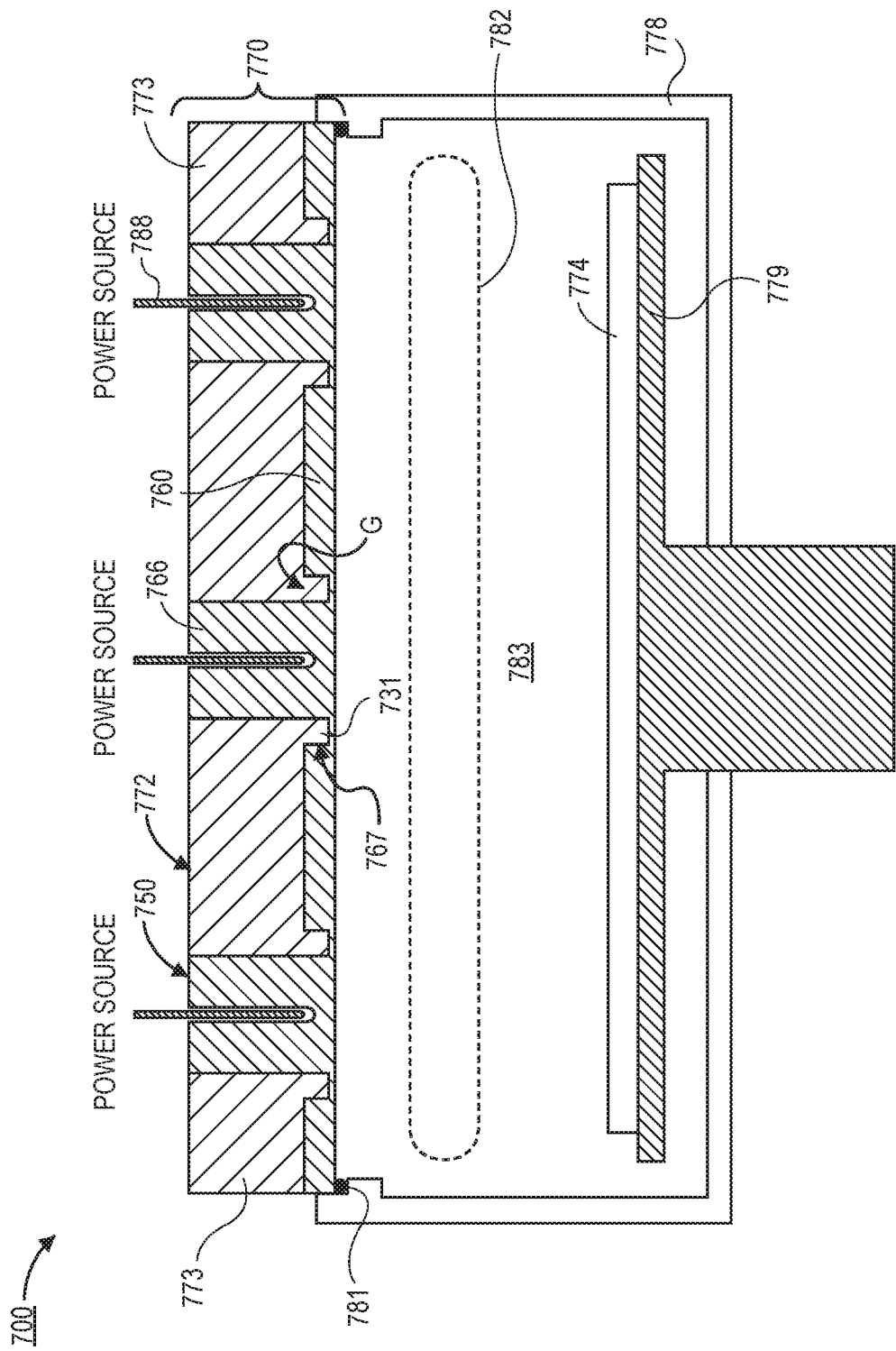
FIG. 7 is a cross-sectional illustration of a processing tool with an assembly that comprises dielectric resonators that are in a cavity with a conductive ring separating the sidewall of the dielectric resonator from a sidewall of the cavity, in accordance with an embodiment.

Referring now to FIG. 7, a cross-sectional illustration of a processing tool 700 that includes an assembly 770 is shown, in accordance with an embodiment. In an embodiment, the processing tool comprises a chamber 778 that is sealed by an assembly 770. For example, the assembly 770 may rest against one or more O-rings 781 to provide a vacuum seal to an interior volume 783 of the chamber 778. In other embodiments, the assembly 770 may interface with the chamber 778. That is, the assembly 770 may be part of a lid that seals the chamber 778. In an embodiment, the processing tool 700 may comprise a plurality of processing volumes (which may be fluidically coupled together), with each processing volume having a different assembly 770. In an embodiment, a chuck 779 or the like may support a workpiece 774 (e.g., wafer, substrate, etc.). In an embodiment, the chamber volume 783 may be suitable for striking a plasma 782. That is, the chamber 778 may be a vacuum chamber.

In an embodiment, the assembly 770 may be substantially similar to the assemblies 670 described above. For example, the assembly 770 comprises a source array 750 and a housing 772. The source array 750 may comprise a dielectric plate 760 and a plurality of dielectric resonators 766 extending up from the dielectric plate 760. Cavities 767 into the dielectric plate 760 may surround each of the dielectric resonators 766. Sidewalls of the cavity 767 are separated from the sidewall of the dielectric resonator 766 by a gap G. The dielectric plate 760 and the dielectric resonators 766 of the source array 750 may be a monolithic structure (as shown in FIG. 7), or the dielectric plate 760 and the dielectric resonators 766 may be discrete components.

The housing 772 include rings 731 that fit into the gaps G. In an embodiment, the rings 731 and the conductive body 773 of the housing 772 are a monolithic structure (as shown in FIG. 7), or the conductive body 773 and the rings 731 may be discrete components. The housing 772 may having openings sized to receive the dielectric resonators 766. In an embodiment, monopole antennas 788 may extend into holes in the dielectric resonators 766. The monopole antennas 788 are each electrically coupled to power sources (e.g., high-frequency emission modules 105).

Figure 8A:
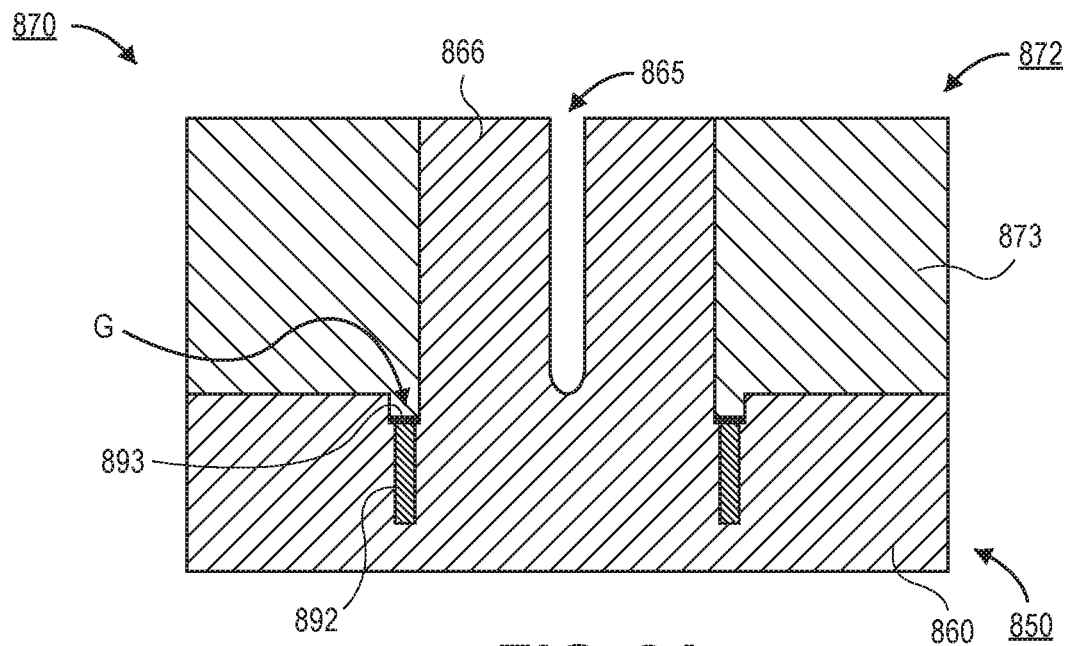
FIG. 8A is a cross-sectional illustration of a source array with a Faraday cage in the dielectric plate, in accordance with an embodiment.
Figure 8B:
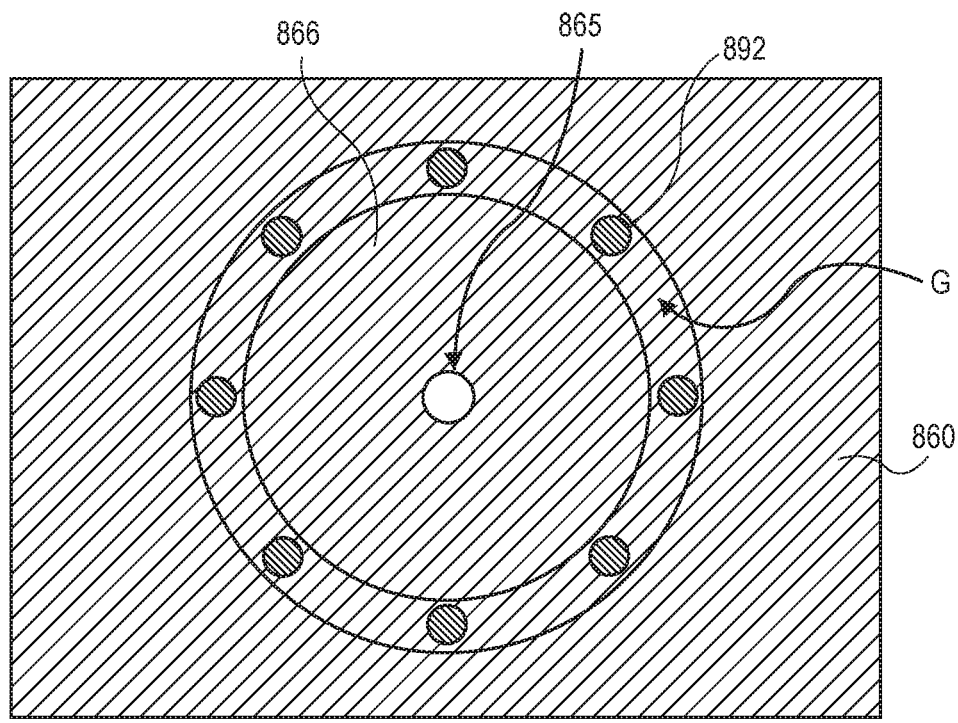
FIG. 8B is a plan view illustration of the source array in FIG. 8A, in accordance with an embodiment.

Referring now to FIGS. 8A and 8B, a cross-sectional illustration and corresponding plan view illustration of an assembly 870 are shown, respectively, in accordance with an additional embodiment. The assembly 870 comprises a source array 850 and a housing 872. The source array 850 may comprise a dielectric plate 860 and a dielectric resonator 866. In the illustrated embodiment, the source array 850 is shown as a monolithic construction. However, a construction with a discrete dielectric plate 860 and a discrete dielectric resonator 866 may also be used. A hole 865 may be provided into the dielectric resonator 866. The housing 872 may comprise a conductive body 873. In an embodiment, the conductive body 873 may extend down into a gap G surrounding the dielectric resonator 866.

In an embodiment, a Faraday cage is disposed into the dielectric plate 860 surrounding the outer perimeter of the dielectric resonator 866. For example, a plurality of pins 892 may be inserted into the dielectric plate 860 below the gap G. While 8 pins 892 are shown, embodiments may include any number of pins 892 sufficient to form a Faraday cage with a desired shielding characteristic. In an embodiment, the pins 892 may be electrically coupled to the conductive body 873. In some embodiments, an RF gasket 893 or the like may be used to improve electrical coupling between the conductive body 873 and the pins 892. Accordingly, the pins 892 may be maintained at a ground potential during operation.

Figure 8C:
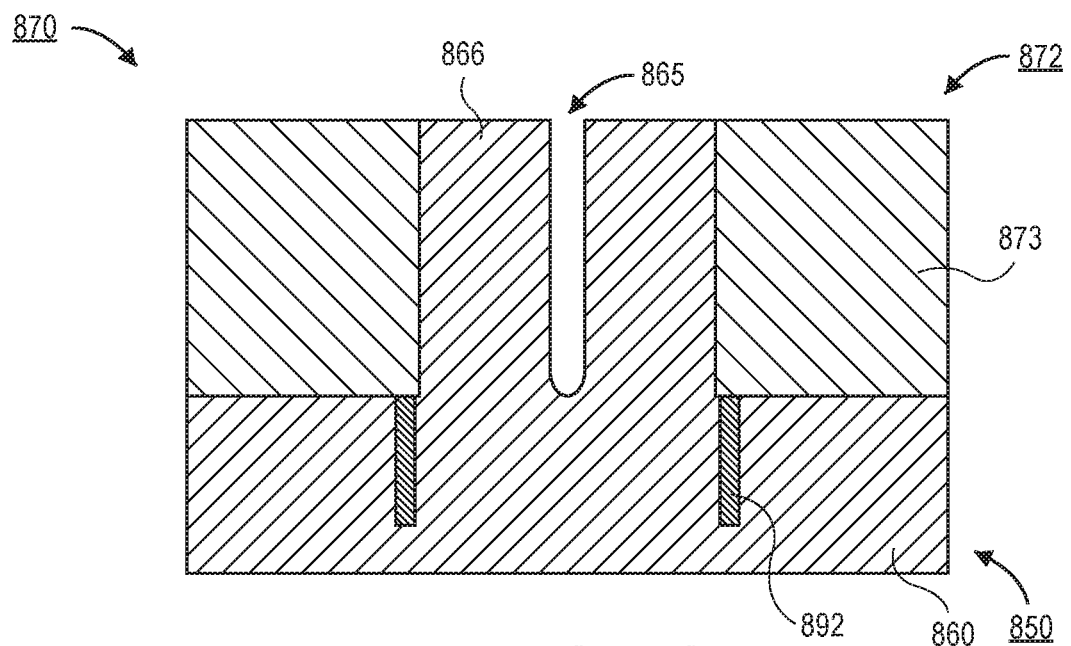
FIG. 8C is a cross-sectional illustration of a source array with a Faraday cage in the dielectric plate, in accordance with an additional embodiment.
Figure 8D:
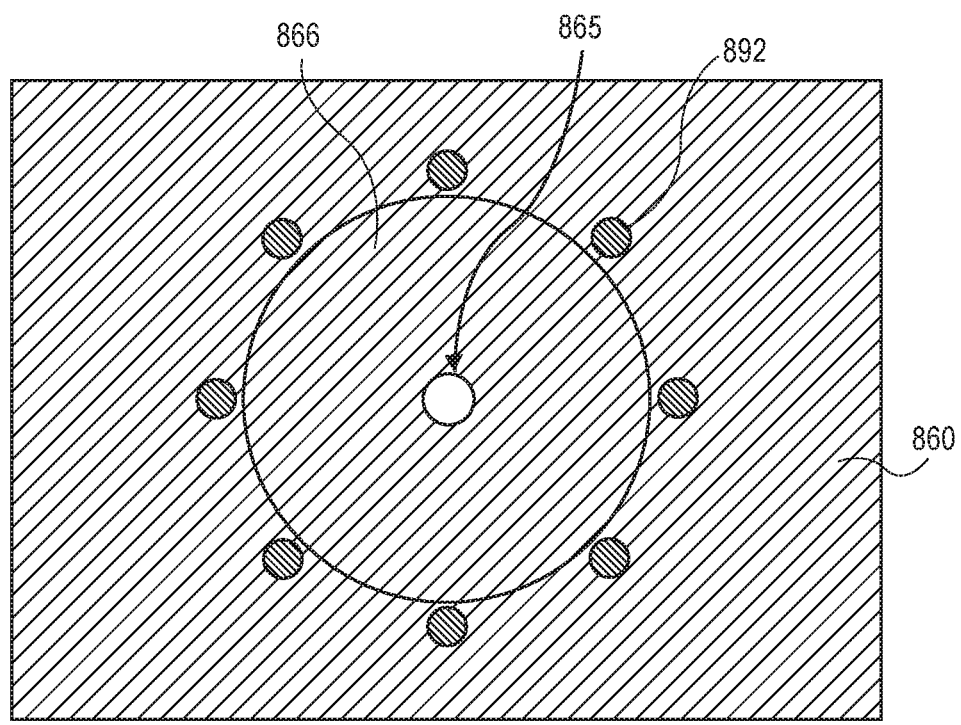
FIG. 8D is a plan view illustration of the source array in FIG. 8C, in accordance with an embodiment.

Referring now to FIGS. 8C and 8D, a cross-sectional illustration and a plan view illustration of an assembly 870 is shown, in accordance with an additional embodiment. The assembly 870 in FIGS. 8C and 8D may be substantially similar to the assembly 870 in FIGS. 8A and 8B, with the exception that the gap G is omitted from the dielectric plate 860. In some embodiments, one or more of the benefits provided by extending a ring into the gap G may be obtained by using a Faraday cage in the dielectric plate 860, and the gap may, therefore, be optionally omitted.

Figure 9:
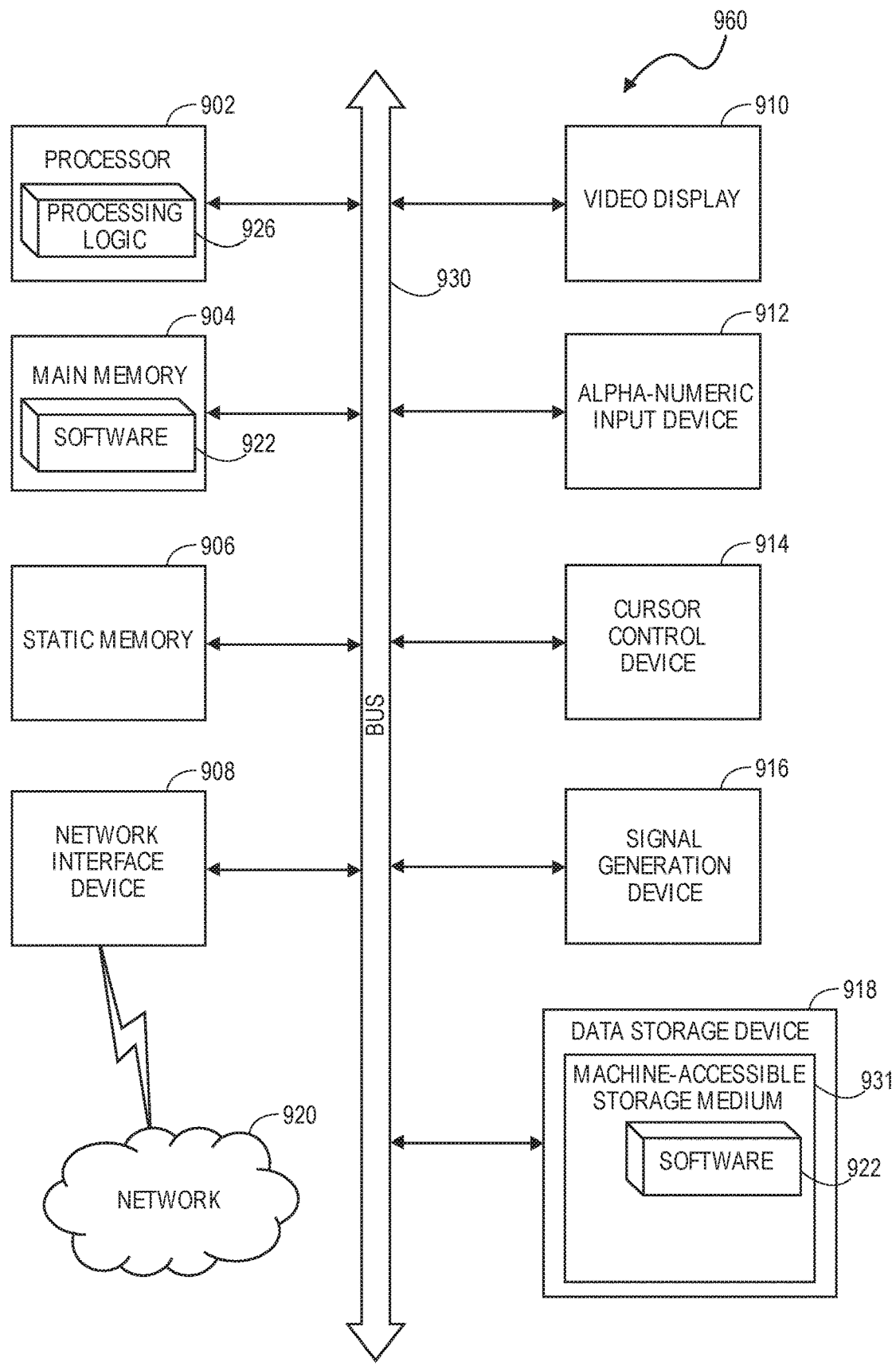
FIG. 9 illustrates a block diagram of an exemplary computer system that may be used in conjunction with a high-frequency plasma tool, in accordance with an embodiment.

Referring now to FIG. 9, a block diagram of an exemplary computer system 960 of a processing tool is illustrated in accordance with an embodiment. In an embodiment, computer system 960 is coupled to and controls processing in the processing tool. Computer system 960 may be connected (e.g., networked) to other machines in a Local Area Network (LAN), an intranet, an extranet, or the Internet. Computer system 960 may operate in the capacity of a server or a client machine in a client-server network environment, or as a peer machine in a peer-to-peer (or distributed) network environment. Computer system 960 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 960, the term "machine" shall also be taken to include any collection of machines (e.g., computers) that individually or jointly execute a set (or multiple sets) of instructions to perform any one or more of the methodologies described herein.

Computer system 960 may include a computer program product, or software 922, having a non-transitory machine-readable medium having stored thereon instructions, which may be used to program computer system 960 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 960 includes a system processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

System processor 902 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 902 may also be one or more special-purpose processing devices such as an application specific integrated circuit (ASIC), a field programmable gate array (FPGA), a digital signal system processor (DSP), network system processor, or the like. System processor 902 is configured to execute the processing logic 926 for performing the operations described herein.

The computer system 960 may further include a system network interface device 908 for communicating with other devices or machines. The computer system 960 may also include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium 931 (or more specifically a computer-readable storage medium) on which is stored one or more sets of instructions (e.g., software 922) embodying any one or more of the methodologies or functions described herein. The software 922 may also reside, completely or at least partially, within the main memory 904 and/or within the system processor 902 during execution thereof by the computer system 960, the main memory 904 and the system processor 902 also constituting machine-readable storage media. The software 922 may further be transmitted or received over a network 920 via the system network interface device 908. In an embodiment, the network interface device 908 may operate using RF coupling, optical coupling, acoustic coupling, or inductive coupling.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A source, comprising:
   a dielectric plate having a first surface and a second surface opposite from the first surface;
   a cavity into the first surface of the dielectric plate, wherein the cavity comprises a third surface that is between the first surface and the second surface; and
   a dielectric resonator extending away from the third surface, wherein a gap is provided between a sidewall of the cavity and a sidewall of the dielectric resonator.

2. The source of claim 1, wherein the dielectric resonator comprises a fourth surface, wherein the first surface of the dielectric plate is between the third surface of the cavity and the fourth surface of the dielectric resonator.

3. The source of claim 1, wherein a width of the dielectric resonator is smaller than a width of the cavity.

4. The source of claim 1, wherein the dielectric resonator is centrally symmetric about an axis through a center of the dielectric resonator.

5. The source of claim 1, further comprising:
   a plurality of cavities; and
   a plurality of dielectric resonators, wherein each dielectric resonator is within a different one of the cavities.

6. The source of claim 1, wherein one or more of the dielectric plate and the dielectric resonator comprises a ceramic.

7. The source of claim 4, wherein a cross-section of the dielectric resonator along a plane parallel to the first surface is circular.

8. The source of claim 1, further comprising:
   a hole in an axial center of the dielectric resonator.

9. The source of claim 8, wherein the hole extends past the first surface of the dielectric plate.

10. The source of claim 4, wherein a cross-section of the dielectric resonator along a plane parallel to the first surface is polygonal.

11. An assembly, comprising:
    a source, wherein the source comprises:
       a dielectric plate;
       a cavity into the dielectric plate; and
       a dielectric resonator in the cavity, wherein a width of the dielectric resonator is smaller than a width of the cavity so that a gap separates a sidewall of the dielectric resonator from a sidewall of the cavity; and
    a housing, wherein the housing comprises:
       a conductive body;
       an opening through the conductive body, wherein the dielectric resonator is within the opening; and
       a conductive ring in the gap separating the sidewall of the dielectric resonator from the sidewall of the cavity.

12. The assembly of claim 11, wherein the dielectric resonator and the dielectric plate are a monolithic component.

13. The assembly of claim 11, wherein the conductive body and the conductive ring are a monolithic component.

14. The assembly of claim 11, wherein the conductive ring separates a sidewall of the opening from the sidewall of the dielectric resonator.

15. The assembly of claim 11, wherein the conductive ring is electrically coupled to the conductive body.

16. The assembly of claim 11, further comprising:
    a hole in an axial center of the dielectric resonator; and
    a monopole antenna in the hole.

17. The assembly of claim 11, wherein the source further comprises:
    a plurality of cavities; and
    a plurality of dielectric resonators, wherein each dielectric resonator is in a different one of the cavities; and
    wherein the housing further comprises:
       a plurality of openings, wherein each dielectric resonator is in a different one of the openings; and
       a plurality of rings, wherein each ring is positioned in a different gap between sidewalls of the dielectric resonators and sidewalls of the cavities.

18. A processing tool, comprising:
    a chamber; and
    an assembly interfacing with the chamber, wherein the assembly comprises:
       a source with a dielectric plate, a cavity in the dielectric plate, and a dielectric resonator in the cavity; and
       a housing with a conductive body with an opening, wherein the dielectric resonator is in the opening, and wherein a conductive ring electrically coupled to the conductive body separates a sidewall of the dielectric resonator from a sidewall of the cavity.

19. The processing tool of claim 18, wherein the dielectric plate and the dielectric resonator are a monolithic component.

20. The processing tool of claim 18, wherein the conductive body and the conductive ring are a monolithic component.

* * * * *